US010090477B2

(12) United States Patent
Nakaie et al.

(10) Patent No.: US 10,090,477 B2
(45) Date of Patent: Oct. 2, 2018

(54) CHARGE-TRANSPORTING VARNISH

(71) Applicant: NISSAN CHEMICAL INDUSTRIES, LTD., Tokyo (JP)

(72) Inventors: Naoki Nakaie, Funabashi (JP); Jun Hashimoto, Funabashi (JP); Haruka Koga, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 15/313,399

(22) PCT Filed: May 20, 2015

(86) PCT No.: PCT/JP2015/064418
§ 371 (c)(1),
(2) Date: Nov. 22, 2016

(87) PCT Pub. No.: WO2015/178407
PCT Pub. Date: Nov. 26, 2015

(65) Prior Publication Data
US 2017/0186982 A1 Jun. 29, 2017

(30) Foreign Application Priority Data
May 23, 2014 (JP) ................................. 2014-106873

(51) Int. Cl.
| C09D 165/00 | (2006.01) |
| H01L 51/00 | (2006.01) |
| C09D 5/24 | (2006.01) |
| C09D 179/02 | (2006.01) |
| H01L 51/50 | (2006.01) |
| H01L 51/56 | (2006.01) |

(52) U.S. Cl.
CPC ............ *H01L 51/0094* (2013.01); *C09D 5/24* (2013.01); *C09D 165/00* (2013.01); *C09D 179/02* (2013.01); *H01L 51/0035* (2013.01); *H01L 51/0039* (2013.01); *H01L 51/0043* (2013.01); *H01L 51/0058* (2013.01); *H01L 51/5056* (2013.01); *H01L 51/5072* (2013.01); *H01L 51/5088* (2013.01); *H01L 51/5092* (2013.01); *H01L 51/56* (2013.01)

(58) Field of Classification Search
None
See application file for complete search history.

(56) References Cited

U.S. PATENT DOCUMENTS

| 6,017,665 | A | * | 1/2000 | Grune | .................. | G03G 5/0564 |
| | | | | | | 252/501.1 |
| 6,616,863 | B1 | * | 9/2003 | Angelopoulos | ........ | C08G 61/12 |
| | | | | | | 252/500 |
| 6,830,830 | B2 | * | 12/2004 | Hsieh | .................... | H01L 51/002 |
| | | | | | | 313/504 |
| 7,201,859 | B2 | | 4/2007 | Lee et al. | | |
| 7,880,164 | B2 | | 2/2011 | Lee et al. | | |
| 8,859,689 | B2 | * | 10/2014 | Lu | ......................... | C08F 283/12 |
| | | | | | | 252/500 |
| 2003/0219625 | A1 | | 11/2003 | Wolk et al. | | |
| 2004/0046498 | A1 | | 3/2004 | Aoki et al. | | |
| 2007/0112133 | A1 | * | 5/2007 | Lee | ........................... | C08K 5/54 |
| | | | | | | 525/100 |
| 2007/0138483 | A1 | * | 6/2007 | Lee | ........................ | C08G 77/54 |
| | | | | | | 257/79 |
| 2010/0230639 | A1 | | 9/2010 | Yamada et al. | | |
| 2011/0195355 | A1 | | 8/2011 | Nakaie et al. | | |
| 2013/0015424 | A1 | | 1/2013 | Chung et al. | | |

FOREIGN PATENT DOCUMENTS

| EP | 3174115 A1 | 5/2017 |
| JP | 2002-6516 A | 1/2002 |
| JP | 2002-15867 A | 1/2002 |
| JP | 2003-45667 A | 2/2003 |
| JP | 2007-169593 A | 7/2007 |
| JP | 2010-40201 A | 2/2010 |
| JP | 2011-54774 A | 3/2011 |
| WO | 2008/129947 A1 | 10/2008 |
| WO | 2010/041701 A1 | 4/2010 |
| WO | 2014/171484 A1 | 10/2014 |

OTHER PUBLICATIONS

International Search Report for PCT/JP2015/064418 (PCT/ISA/210) dated Jul. 14, 2015.
Written Opinion of the International Searching Authority for PCT/JP2015/064418 (PCT/ISA/237) dated Jul. 14, 2015.
Database WPI Week 200310, Thomson Scientific, London, GB; AN 2003-105713, 2003, 1 page, XP002775592.
Extended European Search Report, dated Dec. 1, 2017, for European Application No. 15795894.3.

\* cited by examiner

*Primary Examiner* — Robert S Loewe
(74) *Attorney, Agent, or Firm* — Birch, Stewart, Kolasch & Birch, LLP

(57) ABSTRACT

A thin film that has high flatness and high charge transport properties and enables an organic EL element to achieve excellent luminance characteristics if applied thereto can be obtained by using a charge-transporting varnish which contains a charge-transporting substance, an organosilane compound that is composed of a polymer prepared in advance by subjecting an alkoxysilane compound to hydrolysis-condensation and having a weight average molecular weight of 500-10,000, and an organic solvent, said alkoxysilane compound containing at least one compound selected from among alkoxysilane compounds represented by formulae (1-1) and (1-2). $SiR^1(OR^2)_3$ (1-1) $SiR^1{}_2(OR^2)_2$ (1-2) (In the formulae, each $R^1$ independently represents an alkyl group having 1-20 carbon atoms, which is substituted by $Z^1$, or the like; each $R^2$ independently represents an alkyl group having 1-20 carbon atoms, which may be substituted by $Z^3$; and each of $Z^1$ and $Z^3$ represents a halogen atom or the like.).

12 Claims, No Drawings

CHARGE-TRANSPORTING VARNISH

TECHNICAL FIELD

This invention relates to a charge-transporting varnish. More specifically, the invention relates to a charge-transporting varnish containing an organosilane compound obtained by hydrolytic condensation of a specific alkoxysilane compound.

BACKGROUND ART

Organic electroluminescent (EL) devices are expected to see practical application in such fields as displays and lighting, and so a variety of research has been carried out recently on materials and device structures with the aim of achieving such properties as low-voltage driving, high brightness and longevity.

A plurality of functional thin-films are used in organic EL devices to increase the performance of such devices. Of these films, a hole injection layer or a hole-transporting layer is responsible for transferring charge between an anode and an emissive layer, and thus serves an important function in lowering the driving voltage and increasing the brightness of organic EL devices.

Processes for forming the hole injection layer or hole-transporting layer are broadly divided into dry processes such as vapor deposition and wet processes such as spin coating. On comparing these processes, wet processes are better able to efficiently produce thin-films having a high flatness over a large surface area and therefore are often used particularly in the field of displays.

Given the desire today for enhanced organic EL device performance, improvements in the wet process materials for hole injection layers or hole-transporting layers are constantly being sought. In particular, because they can help improve the brightness characteristics or longevity characteristics of organic EL devices, there is a growing desire for materials which provide charge-transporting thin-films of excellent flatness.

PRIOR ART DOCUMENTS

Patent Documents

Patent Document 1: JP-A 2003-045667
Patent Document 2: JP-A 2007-169593

SUMMARY OF THE INVENTION

Problems to be Solved by the Invention

Accordingly, the object of this invention is to provide a charge transporting varnish that is capable of forming a thin-film which has a high flatness and high charge-transportability, and which, when used in an organic EL device, enables excellent brightness characteristics to be achieved.

Means for Solving the Problems

The inventors have conducted extensive investigations, as a result of which they have found that a charge-transporting varnish which includes a charge-transporting substance and an organic solvent, and also includes a specific organosilane compound, is capable of giving a thin-film having a high flatness and high charge-transportability. They have also discovered that when such a thin-film is used in an organic EL device, excellent brightness characteristics can be achieved.

It has been reported that, by including glycidoxypropyltrimethoxysilane or a specific siloxane substance in a composition containing a conductive polymer such as polystyrenesulfonic acid or polyaniline, the brightness characteristics and longevity of organic EL devices having a thin-film obtained from such a composition can be improved (see Patent Documents 1 and 2). However, there are no reports in the literature on charge-transporting varnishes which include the organosilane compound used in the present invention.

Accordingly, the invention provides:

1. A charge-transporting varnish comprising a charge-transporting substance, an organosilane compound and an organic solvent, which charge-transporting varnish is characterized in that the organosilane compound is a polymer that has a weight-average molecular weight of 500 to 10,000 and is prepared beforehand by hydrolytic condensation of an alkoxysilane compound, the alkoxysilane compound being at least one selected from among alkoxysilane compounds of formulas (1-1) and (1-2)

$$SiR^1(OR^2)_3 \qquad (1\text{-}1)$$

$$SiR^1_2(OR^2)_2 \qquad (1\text{-}2)$$

(wherein each $R^1$ is independently an alkyl group of 1 to 20 carbon atoms that is substituted with $Z^1$ or an aryl group of 6 to 20 carbon atoms that is substituted with $Z^2$; each $R^2$ is independently an alkyl group of 1 to 20 carbon atoms that may be substituted with $Z^3$; $Z^1$ is a halogen atom, a cyano group, a nitro group, an alkoxy group of 1 to 20 carbon atoms that is substituted with $Z^3$, an aryl group of 6 to 20 carbon atoms that is substituted with $Z^3$, or a heteroaryl group of 2 to 20 carbon atoms that is substituted with $Z^3$; $Z^2$ is a halogen atom, a cyano group, a nitro group, or an alkyl group of 1 to 20 carbon atoms that is substituted with $Z^3$; and $Z^3$ is a halogen atom, a cyano group or a nitro group);

2. The charge-transporting varnish of 1 above, wherein the alkoxysilane compound includes at least one compound selected from among alkoxysilane compounds of formulas (1-1) and (1-2) and at least one compound selected from among alkoxysilane compounds of formulas (2-1) to (2-3)

$$Si(OR^3)_4 \qquad (2\text{-}1)$$

$$SiR^4_2(OR^3)_2 \qquad (2\text{-}2)$$

$$SiR^4(OR^3)_3 \qquad (2\text{-}3)$$

(wherein each $R^3$ is independently an alkyl group of 1 to 20 carbon atoms that may be substituted with $Z^3$; each $R^4$ is independently an alkyl group of 1 to 20 carbon atoms, an alkenyl group of 2 to 20 carbon atoms that may be substituted with $Z^4$, an alkynyl group of 2 to 20 carbon atoms that may be substituted with $Z^4$, an aryl group of 6 to 20 carbon atoms, or a heteroaryl group of 2 to 20 carbon atoms that may be substituted with $Z^5$; $Z^3$ is as defined above; $Z^4$ is a halogen atom, a nitro group, a cyano group, a hydroxyl group, a thiol group, an aryl group of 6 to 20 carbon atoms that may be substituted with $Z^6$, or a heteroaryl group of 2 to 20 carbon atoms that may be substituted with $Z^6$; $Z^5$ is a halogen atom, a nitro group, a cyano group, a hydroxyl group, a thiol group, an alkyl group of 1 to 20 carbon atoms that may be substituted with $Z^6$, an alkenyl group of 1 to 20 carbon atoms that may be substituted with $Z^6$, or an alkynyl group of 1 to 20 carbon atoms that may be substituted with $Z^6$; and $Z^6$ is a halogen atom, a nitro group, a cyano group, a hydroxyl group or a thiol group);

3. The charge-transporting varnish of 1 or 2 above, wherein the alkoxysilane compound includes an alkoxysilane compound of formula (1-1) and an alkoxysilane compound of formula (2-1);

4. The charge-transporting varnish of any one of 1 to 3 above, wherein the charge-transporting substance is an aniline derivative;

5. A charge-transporting thin-film produced using the charge-transporting varnish of any one of 1 to 4 above;

6. An organic electroluminescent device comprising the charge-transporting thin-film of 5 above;

7. The organic electroluminescent device of 6 above, wherein the charge-transporting thin-film is a hole injection layer or a hole-transporting layer;

8. A method of producing a charge-transporting thin-film, which method is characterized by the steps of applying the charge-transporting varnish of any one of 1 to 4 above onto a substrate, and evaporating off the solvent;

9. A method of fabricating an organic electroluminescent device, which method is characterized by using the charge-transporting thin-film of 5 above;

10. A method of deepening the ionization potential of a charge-transporting thin-film obtained from a charge-transporting varnish containing a charge-transporting substance and an organic solvent, which method is characterized by comprising the step of adding to the charge-transporting varnish a polymer that has a weight-average molecular weight of 500 to 10,000 and is prepared by hydrolytic condensation of at least one alkoxysilane compound selected from among alkoxysilane compounds of formulas (1-1) and (1-2)

$$SiR^1(OR^2)_3 \quad (1\text{-}1)$$

$$SiR^1{}_2(OR^2)_2 \quad (1\text{-}2)$$

(wherein each $R^1$ is independently an alkyl group of 1 to 20 carbon atoms that is substituted with $Z^1$ or an aryl group of 6 to 20 carbon atoms that is substituted with $Z^2$; each $R^2$ is independently an alkyl group of 1 to 20 carbon atoms that may be substituted with $Z^3$; $Z^1$ is a halogen atom, a cyano group, a nitro group, an alkoxy group of 1 to 20 carbon atoms that is substituted with $Z^3$, an aryl group of 6 to 20 carbon atoms that is substituted with $Z^3$, or a heteroaryl group of 2 to 20 carbon atoms that is substituted with $Z^3$; $Z^2$ is a halogen atom, a cyano group, a nitro group, or an alkyl group of 1 to 20 carbon atoms that is substituted with $Z^3$; and $Z^3$ is a halogen atom, a cyano group or a nitro group); and 11. A method of deepening the ionization potential of a charge-transporting thin-film containing a charge-transporting substance, which method is characterized by comprising the step of, during formation of the charge-transporting thin-film, introducing a polymer that has a weight-average molecular weight of 500 to 10,000 and is prepared by hydrolytic condensation of at least one alkoxysilane compound selected from among alkoxysilane compounds of formulas (1-1) and (1-2) below into the charge-transporting thin-film together with the charge-transporting substance $$SiR^1(OR^2)_3 \quad (1\text{-}1)$$

$$SiR^1{}_2(OR^2)_2 \quad (1\text{-}2)$$

(wherein each $R^1$ is independently an alkyl group of 1 to 20 carbon atoms that is substituted with $Z^1$ or an aryl group of 6 to 20 carbon atoms that is substituted with $Z^2$; each $R^2$ is independently an alkyl group of 1 to 20 carbon atoms that may be substituted with $Z^3$; $Z^1$ is a halogen atom, a cyano group, a nitro group, an alkoxy group of 1 to 20 carbon atoms that may be substituted with $Z^3$, an aryl group of 6 to 20 carbon atoms that may be substituted with $Z^3$, or a heteroaryl group of 2 to 20 carbon atoms that may be substituted with $Z^3$; $Z^2$ is a halogen atom, a cyano group, a nitro group, or an alkyl group of 1 to 20 carbon atoms that may be substituted with $Z^3$; and $Z^3$ is a halogen atom, a cyano group or a nitro group).

Advantageous Effects of the Invention

Using the charge-transporting varnish of the invention, charge-transporting thin-films of good flatness can be reproducibly obtained by various wet processes.

Also, because the charge-transporting varnish of the Invention includes a specific organosilane compound, compared with charge-transporting varnishes that do not include this compound, thin-films formed therewith have a deeper ionization potential, enabling the barrier to charge transport between this thin-film and the adjoining cathode-side functional thin-film to be lowered.

The inventive charge-transporting thin-film having a good flatness and a suitable ionization potential, when employed as a hole injection layer or a hole-transporting layer, preferably as a hole-transporting layer, in an organic EL device, can improve the brightness characteristics of the device.

The charge-transporting varnish of the invention can reproducibly form thin-films having excellent charge-transporting properties, even when various wet processes capable of film formation over a large area, such as spin coating, or slit coating are used, and therefore is capable of fully accommodating recent advances in the field of organic EL devices.

The charge-transporting thin-film of the invention is expected to be used also as, for example, protective films for capacitor electrodes, antistatic films, and anode buffer layers in organic thin-film solar cells.

EMBODIMENT FOR CARRYING OUT THE INVENTION

The invention is described more fully below.

The charge-transporting varnish according to this invention includes a charge-transporting substance, an organosilane compound which is a polymer that has a weight-average molecular weight of 500 to 10,000 and is prepared beforehand by hydrolytic condensation of an alkoxysilane compound, and an organic solvent. The alkoxysilane compound includes at least one alkoxysilane compound selected from among alkoxysilane compounds of formulas (1-1) and (1-2).

$$SiR^1(OR^2)_3 \quad (1\text{-}1)$$

$$SiR^1{}_2(OR^2)_2 \quad (1\text{-}2)$$

To further increase the molecular weight of the polymer, it is preferable for the alkoxysilane compound to include a trialkoxysilane compound of formula (1-1).

Here, each $R^1$ is independently an alkyl group of 1 to 20 carbon atoms that is substituted with $Z^1$ or an aryl group of 6 to 20 carbon atoms that is substituted with $Z^2$; each $R^2$ is independently an alkyl group of 1 to 20 carbon atoms that is substituted with $Z^3$; $Z^1$ is a halogen atom, a cyano group, a nitro group, an alkoxy group of 1 to 20 carbon atoms that is substituted with $Z^3$, an aryl group of 6 to 20 carbon atoms that is substituted with $Z^3$, or a heteroaryl group of 2 to 20 carbon atoms that is substituted with $Z^3$; $Z^2$ is a halogen atom, a cyano group, a nitro group, or an alkyl group of 1 to 20 carbon atoms that is substituted with $Z^3$; and $Z^3$ is a halogen atom, a cyano group or a nitro group.

Examples of halogen atoms include fluorine, chlorine, bromine and iodine atoms.

The alkyl group of 1 to 20 carbon atoms may be linear, branched or cyclic, and is exemplified by linear or branched alkyl groups of 1 to 20 carbon atoms, such as methyl, ethyl, n-propyl, isopropyl, n-butyl, isobutyl, s-butyl, t-butyl, n-pentyl, n-hexyl, n-heptyl, n-octyl, n-nonyl and n-decyl groups; and cyclic alkyl groups of 3 to 20 carbon atoms, such as cyclopropyl, cyclobutyl, cyclopentyl, cyclohexyl, cycloheptyl, cyclooctyl, cyclononyl, cyclodecyl, bicyclobutyl, bicyclopentyl, bicyclohexyl, bicycloheptyl, bicyclooctyl, bicyclononyl and bicyclodecyl groups.

Examples of alkoxy groups of 1 to 20 carbon atoms include linear or branched alkoxy groups of 1 to 20 carbon atoms, such as methoxy, ethoxy, n-propoxy, isopropoxy, n-butyloxy, isobutyloxy, s-butyloxy, t-butyloxy, n-pentyloxy, n-hexyloxy, n-heptyloxy, n-octyloxy, n-nonyloxy and n-decyloxy groups; and cyclic alkoxy groups of 3 to 20 carbon atoms, such as cyclopropyloxy, cyclobutyloxy, cyclopentyloxy, cyclohexyloxy, cycloheptyloxy, cyclooctyloxy, cyclononyloxy and cyclodecyloxy groups.

Examples of aryl groups of 6 to 20 carbon atoms include phenyl, 1-naphthyl, 2-naphthyl, 1-anthryl, 2-anthryl, 9-anthryl, 1-phenanthryl, 2-phenanthryl, 3-phenanthryl, 4-phenanthryl and 9-phenanthryl groups.

Examples of heteroaryl groups of 2 to 20 carbon atoms include 2-thienyl, 3-thienyl, 2-furanyl, 3-furanyl, 2-oxazolyl, 4-oxazolyl, 5-oxazolyl, 3-isooxazolyl, 4-isooxazolyl, 5-isooxazolyl, 2-thiazolyl, 4-thiazolyl, 5-thiazolyl, 3-isothiazolyl, 4-isothiazolyl, 5-isothiazolyl, 2-imidazolyl, 4-imidazolyl, 2-pyridyl, 3-pyridyl and 4-pyridyl groups.

In $R^1$ and $R^2$, the number of carbon atoms on the alkyl group is preferably 10 or less, more preferably 6 or less, and even more preferably 4 or less.

The number of carbon atoms on the aryl and heteroaryl groups is preferably 14 or less, more preferably 10 or less, and even more preferably 6 or less.

$Z^1$ and $Z^2$ are preferably halogen atoms, and most preferably fluorine atoms. $Z^3$ preferably does not exist (i.e., is non-substituting) on $R^2$, and is preferably a halogen atom, and most preferably a fluorine atom, on $Z^1$ and $Z^2$.

The alkyl group of 1 to 20 carbon atoms that is substituted with $Z^3$ is exemplified by alkyl groups of 1 to 20 carbon atoms in which at least one hydrogen atom is substituted with $Z^3$. Specific examples include halogenated alkyl groups such as chloromethyl, dichloromethyl, trichloromethyl, bromomethyl, dibromomethyl, tribromomethyl, fluoromethyl, difluoromethyl, trifluoromethyl, 2,2,2-trichloroethyl, pentachloroethyl, 2,2,2-tribromoethyl, pentabromoethyl, 2,2,2-trifluoroethyl, pentafluoroethyl, 3,3,3-trichloropropyl, 2,2,3,3-tetrachloropropyl, 2,2,3,3,3-pentachloropropyl, heptachloropropyl, heptachloroisopropyl, 3,3,3-tribromopropyl, 2,2,3,3-tetrabromopropyl, 2,2,3,3,3-pentabromopropyl, heptabromopropyl, heptabromoisopropyl, 3,3,3-trifluoropropyl, 2,2,3,3-tetrafluoropropyl, 2,2,3,3,3-pentafluoropropyl, heptafluoropropyl, heptafluoroisopropyl, 2,2,2-trichloro-1-(trichloromethyl)ethyl, 2,2,2-tribromo-1-(tribromomethyl)ethyl, 2,2,2-trifluoro-1-(trifluoromethyl)ethyl, 4,4,4-trichlorobutyl, nanochlorobutyl, 4,4,4-tribromobutyl, nanobromobutyl, 4,4,4-trifluorobutyl, nanofluorobutyl, 2,2,3,3,4,4,5,5-octachloropentyl, 2,2,3,3,4,4,5,5,5-nonachloropentyl, undecachloropentyl, 2,2,3,3,4,4,5,5-octabromopentyl, 2,2,3,3,4,4,5,5-nonabromopentyl, undecabromopentyl, 2,2,3,3,4,4,5,5-octafluoropentyl, 2,2,3,3,4,4,5,5,5-nonafluoropentyl, undecafluoropentyl, 3,3,4,4,5,5,6,6,6-nonachlorohexyl, 2,2,3,3,4,4,5,5,6,6-decachlorohexyl, 2,2,3,3,4,4,5,5,6,6,6-undecachlorohexyl, tridecachlorohexyl, 3,3,4,4,5,5,6,6,6-nonabromohexyl, 2,2,3,3,4,4,5,5,6,6-decabromohexyl, 2,2,3,3,4,4,5,5,6,6,6-undecabromohexyl, tridecabromohexyl, 3,3,4,4,5,5,6,6,6-nonafluorohexyl, 2,2,3,3,4,4,5,5,6,6-decafluorohexyl, 2,2,3,3,4,4,5,5,6,6,6-undecafluorohexyl, tridecafluorohexyl, tridecachloro-1,1,2,2-tetrahydrooctyl, perchlorooctyl, tridecabromo-1,1,2,2-tetrahydrooctyl, perbromooctyl, tridecafluoro-1,1,2,2-tetrahydrooctyl, perfluorooctyl, heptadecachloro-1,1,2,2-tetrahydrodecyl, heptadecabromo-1,1,2,2-tetrahydrodecyl and heptadecafluoro-1,1,2,2-tetrahydrodecyl groups; cyanoalkyl groups such as cyanomethyl, 2-cyanoethyl, 3-cyanopropyl and 4-cyanobutyl groups; and nitroalkyl groups such as nitromethyl, 2-nitroethyl, 3-nitropropyl and 4-nitrobutyl groups. Halogenated alkyl groups are preferred, with fluorinated alkyl groups being more preferred.

Alkyl groups of 1 to 20 carbon atoms that are substituted with $Z^1$ are exemplified by those in which at least one hydrogen atom on the foregoing alkyl groups of 1 to 20 carbon atoms is substituted with $Z^1$. Specific examples include, in addition to the groups mentioned above as examples of alkyl groups of 1 to 20 carbon atoms that are substituted with $Z^3$: 3-(heptafluoroisopropoxy)propyl and 4-trifluoromethylphenylmethyl groups. Alkyl groups substituted with an alkoxy, aryl or heteroaryl group having a halogen atom are preferred, and alkyl groups substituted with an alkoxy, aryl or heteroaryl group having a fluorine atom are more preferred.

Alkoxy groups of 1 to 20 carbon atoms that are substituted with $Z^3$ are exemplified by the groups formed by removing a hydroxyl group hydrogen atom from an alcohol having the foregoing alkyl group of 1 to 20 carbon atoms that is substituted with $Z^3$. Specific examples include chloromethoxy, dichloromethoxy, trichloromethoxy, bromomethoxy, dibromomethoxy, tribromomethoxy, fluoromethoxy, difluoromethoxy, trifluoromethoxy, 2,2,2-trichloroethoxy, pentachloroethoxy, 2,2,2-tribromoethoxy, pentabromoethoxy, 2,2,2-trifluoroethoxy, pentafluoroethoxy, 3,3,3-trichloropropoxy, 2,2,3,3-tetrachloropropoxy, 2,2,3,3,3-pentachloropropoxy, heptachloropropoxy, heptachloroisopropoxy, 3,3,3-tribromopropoxy, 2,2,3,3-tetrabromopropoxy, 2,2,3,3,3-pentabromopropoxy, heptabromopropoxy, heptabromoisopropoxy, 3,3,3-trifluoropropoxy, 2,2,3,3-tetrafluoropropoxy, 2,2,3,3,3-pentafluoropropoxy, heptafluoropropoxy and heptafluoroisopropoxy groups. A halogenated alkoxy group is preferred, and a fluorinated alkoxy group is more preferred.

Aryl groups of 6 to 20 carbon atoms that are substituted with $Z^3$ are exemplified by the foregoing aryl groups of 6 to 20 carbon atoms in which at least one hydrogen atom is substituted with $Z^3$. Specific examples include halogenated aryl groups such as 4-chlorophenyl, 4-bromophenyl, 4-fluorophenyl, 2,4-dichlorophenyl, 2,4-dibromophenyl, 2,4-difluorophenyl, pentachlorophenyl, pentabromophenyl and pentafluorophenyl groups; cyanoaryl groups such as 4-cyanophenyl, 2,4-dicyanophenyl and 2,4,6-tricyanophenyl groups; and nitroaryl groups such as 4-nitrophenyl, 2,4-dinitrophenyl and 2,4,6-trinitrophenyl groups. Halogenated aryl groups are preferred, and fluorinated aryl groups are more preferred.

Examples of aryl groups of 6 to 20 carbon atoms that are substituted with $Z^2$ include, in addition to the groups mentioned above as examples of aryl groups of 6 to 20 carbon atoms that are substituted with $Z^3$: aryl groups having halogenated alkyl groups, such as 4-trichloromethylphenyl, 4-tribromomethylphenyl and 4-trifluoromethylphenyl groups. Aryl groups having fluorinated alkyl groups are preferred.

Heteroaryl groups of 2 to 20 carbon atoms that are substituted with $Z^3$ include the foregoing heteroaryl groups of 2 to 20 carbon atoms in which at least one hydrogen atom is substituted with $Z^3$. Specific examples include halogenated thienyl groups such as 5-chloro-thiophen-2-yl, 5-bromothiophen-2-yl, 5-fluorothiophen-2-yl, 5-chlorothiophen-3-yl, 5-bromothiophen-3-yl and 5-fluorothiophen-3-yl groups; cyanothienyl groups such as 5-cyanothiophen-2-yl and 5-cyanothiopen-3-yl groups; nitrothienyl groups such as 5-nitrothiophen-2-yl and 5-nitrothiophen-3-yl groups; halogenated (uranyl groups such as 5-chlorofuran-2-yl, 5-bromofuran-2-yl, 5-fluorofuran-2-yl, 5-chlorofuran-3-yl, 5-bromofuran-3-yl and 5-fluorofuran-3-yl groups; cyanofuranyl groups such as 5-cyanofuran-2-yl and 5-cyanofuran-3-yl groups; nitrofuranyl groups such as 5-nitrofuran-2-yl and 5-nitrofuran-3-yl groups; halogenated pyridyl groups such as 6-chloropyridin-2-yl, 6-bromopyridin-2-yl, 6-fluoropyridin-2-yl, 6-chloropyridin-3-yl, 6-bromopyridin-3-yl, 6-fluoropyridin-3-yl, 6-chloropyridin-4-yl, 6-bromopyridin-4-yl and 6-fluoropyridin-4-yl groups; cyanopyridyl groups such as 6-cyanopyridin-2-yl, 6-cyanoyridin-3-yl and 6-cyanopyridin-4-yl groups; and nitropyridyl groups such as 6-nitropyridin-2-yl, 6-nitropyridin-3-yl and 6-nitropyridin-4-yl groups.

Specific examples of trialkoxysilanes of formula (1-1) include triethoxy(4-(trifluoromethyl)phenyl)silane, 3,3,3-trifluoropropyltrimethoxysilane, perfluorooctyltriethoxysilane, tridecafluoro-1,1,2,2-tetrahydrooctyltriethoxysilane, pentafluorophenyltrimethoxysilane, pentafluorophenyltriethoxysilane, 3-(heptafluoroisopropoxy)propyltriethoxysilane and heptadecafluoro-1,1,2,2-tetrahydrodecyltriethoxysilane.

The dialkoxysilane of formula (1-2) is exemplified by 3,3,3-trifluoropropylmethyldimethoxysilane.

When preparing the organosilane compound (polymer) used in this invention, at least one alkoxysilane compound of any of formulas (2-1) to (2-3) below may be used together with the alkoxysilane compound of formula (1-1) and/or formula (1-2). To further increase the molecular weight of the resulting polymer, the use of a tetraalkoxysilane compound of formula (2-1) is especially preferred.

$$\mathrm{Si(OR^3)_4} \quad (2\text{-}1)$$

$$\mathrm{SiR^4{}_2(OR^3)_2} \quad (2\text{-}2)$$

$$\mathrm{SiR^4(OR^3)_3} \quad (2\text{-}3)$$

Here, each $R^3$ is independently an alkyl group of 1 to 20 carbon atoms that may be substituted with $Z^3$; each $R^4$ is independently an alkyl group of 1 to 20 carbon atoms, an alkenyl group of 2 to 20 carbon atoms that may be substituted with $Z^4$, an alkynyl group of 2 to 20 carbon atoms that may be substituted with $Z^4$, an aryl group of 6 to 20 carbon atoms, or a heteroaryl group of 2 to 20 carbon atoms that may be substituted with $Z^5$; $Z^4$ is a halogen atom, a nitro group, a cyano group, a hydroxyl group, a thiol group, an aryl group of 6 to 20 carbon atoms that may be substituted with $Z^6$, or a heteroaryl group of 2 to 20 carbon atoms that may be substituted with $Z^6$; $Z^5$ is a halogen atom, a nitro group, a cyano group, a hydroxyl group, a thiol group, an alkyl group of 1 to 20 carbon atoms that may be substituted with $Z^6$, an alkenyl group of 1 to 20 carbon atoms that may be substituted with $Z^6$, or an alkynyl group of 1 to 20 carbon atoms that may be substituted with $Z^6$; and $Z^6$ is a halogen atom, a nitro group, a cyano group, a hydroxyl group or a thiol group. Also, $Z^3$ is as defined above.

Specific examples of alkenyl groups of 2 to 20 carbon atoms include ethenyl, n-1-propenyl, n-2-propenyl, 1-methylethenyl, n-1-butenyl, n-2-butenyl, n-3-butenyl, 2-methyl-1-propenyl, 2-methyl-2-propenyl, 1-ethylethenyl, 1-methyl-1-propenyl, 1-methyl-2-propenyl, n-1-pentenyl, n-1-decenyl and n-1-eicosenyl groups.

Specific examples of alkynyl groups of 2 to 20 carbon atoms include ethynyl, n-1-propynyl, n-2-propynyl, n-1-butynyl, n-2-butynyl, n-3-butynyl, 1-methyl-2-propynyl, n-1-pentynyl, n-2-pentynyl, n-3-pentynyl, n-4-pentynyl, 1-methyl-n-butynyl, 2-methyl-n-butynyl, 3-methyl-n-butynyl, 1,1-dimethyl-n-propynyl, n-1-hexynyl, n-1-decynyl, n-1-pentadecynyl and n-1-eicosynyl groups.

The halogen atoms, alkyl groups of 2 to 20 carbon atoms, aryl groups of 6 to 20 carbon atoms and heteroaryl groups of 2 to 20 carbon atoms are exemplified in the same way as above.

In $R^3$ and $R^4$, the number of carbon atoms on the alkyl, alkenyl and alkynyl groups is preferably 10 or less, more preferably 6 or less, and even more preferably 4 or less.

The number of carbon atoms on the aryl and heteroaryl groups is preferably 14 or less, more preferably 10 or less, and even more preferably 6 or less.

$R^3$ is preferably an alkyl group of 1 to 6 carbon atoms, more preferably an alkyl group of 1 to 4 carbon atoms, and even more preferably a methyl or ethyl group.

$R^4$ is preferably an alkyl group of 1 to 20 carbon atoms or an aryl group of 6 to 20 carbon atoms, more preferably an alkyl group of 1 to 10 carbon atoms or an aryl group of 6 to 14 carbon atoms, even more preferably an alkyl group of 1 to 6 carbon atoms or an aryl group of 6 to 10 carbon atoms, and still more preferably an alkyl group of 1 to 4 carbon atoms or a phenyl group.

A plurality of $R^3$ may all be the same or may be different. Likewise, a plurality of $R^4$ may all be the same or may be different.

$Z^3$ is preferably a halogen atom, more preferably a fluorine atom, and most preferably does not exist (i.e., is non-substituting).

$Z^4$ is preferably a halogen atom, a phenyl group which may be substituted with $Z^6$, or a furanyl group which may be substituted with $Z^6$; more preferably a halogen atom; and even more preferably a fluorine atom or does not exist (i.e., is non-substituting).

$Z^5$ is preferably a halogen atom, an alkyl group of 1 to 20 carbon atoms which may be substituted with $Z^6$, or a furanyl group which may be substituted with $Z^6$; more preferably a halogen atom; and even more preferably a fluorine atom or does not exist (i.e., is non-substituting).

$Z^6$ is preferably a halogen atom, and more preferably a fluorine atom or does not exist (i.e., is non-substituting).

Specific examples of tetraalkoxysilane compounds of formula (2-1) include tetraethoxysilane, tetramethoxysilane and tetrapropoxysilane.

Specific examples of dialkoxysilane compounds of formula (2-2) include dimethyldimethoxysilane, dimethyldiethoxysilane, methylethyldimethoxysilane, diethyldimethoxysilane, diethyldiethoxysilane, methylpropyldimethoxysilane, methylpropyldiethoxysilane, diisopropyldimethoxysilane, phenylmethyldimethoxysilane and vinylmethyldimethoxysilane.

Specific examples of trialkoxysilane compounds of formula (2-3) include methyltrimethoxysilane, methyltriethoxysilane, ethyltrimethoxysilane, ethyltriethoxysilane, propyltrimethoxysilane, propyltriethoxysilane, butyltrimethoxysilane, butyltriethoxysilane, pentyltrimethoxysilane, pentyltriethoxysilane, heptyltrimethoxysilane, heptyltriethoxysilane, octyltrimethoxysilane, octyltriethoxysilane, dodecyltrimethoxysilane, dodecyltriethoxysilane, hexadecyltrimethoxysilane, hexadecyltriethoxysilane, octadecyltrimethoxysilane, octadecyltriethoxysilane, phenyltrimethoxysilane, phenyltriethoxysilane, vinyltrimethoxysilane, vinyltriethoxysilane, triethoxy-2-thienylsilane and 3-(triethoxysilyl)furan.

The content of organosilane compound in the charge-transporting varnish of the invention is typically about 0.1 to 50 wt %, based on the weight of the charge-transporting substance. To suppress a decrease in the charge-transportability of the resulting thin-film, this content is preferably about 0.5 to 40 wt %, more preferably about 0.8 to 30 wt %, and still more preferably about 1 to 20 wt %.

The organosilane compound (polymer) can be obtained by (partial) hydrolytic condensation of one of the above single alkoxysilane compounds, or a mixture of two or more, in the presence of water.

The method of hydrolysis used is not particularly limited, and may be a common method. By way of illustration, one such method involves treating the alkoxysilane compound in an aqueous solvent at about 20 to 100° C. for 1 to 24 hours. An acid or a base may be used at this time as a catalyst.

The charge-transporting substance used in this invention is not particularly limited, provided it is a charge-transporting monomer or a charge-transporting oligomer or polymer that has hitherto been used in organic EL devices. Examples include various hole-transporting substances such as aniline derivatives, thiophene derivative and pyrrole derivatives. Of these, aniline derivatives and thiophene derivatives are preferred. Aniline derivatives are more preferred.

Specific examples of aniline derivatives include those of formula (3) below.

be substituted with $Z^7$, an aryl group of 6 to 20 carbon atoms or heteroaryl group of 2 to 20 carbon atoms which may be substituted with $Z^8$, or a —$NHY^2$, —$NY^3Y^4$, —$C(O)Y^5$, —$OY^6$, —$SY^7$, —$SO_3Y^8$, —$C(O)OY^9$, —$OC(O)Y^{10}$, —$C(O)NHY^{11}$ or —$C(O)NY^{12}Y^{12}$ group.

$Y^2$ to $Y^{13}$ are each independently an alkyl group of 1 to 20 carbon atoms, alkenyl group of 2 to 20 carbon atoms or alkynyl group of 2 to 20 carbon atoms which may be substituted with $Z^7$, or an aryl group of 6 to 20 carbon atoms or heteroaryl group of 2 to 20 carbon atoms which may be substituted with $Z^8$.

$Z^7$ is a halogen atom, a nitro group, a cyano group, an amino group, an aldehyde group, a hydroxyl group, a thiol group, a sulfonic acid group, a carboxylic acid group, or an aryl group of 6 to 20 carbon atoms or heteroaryl group of 2 to 20 carbon atoms which may be substituted with $Z^9$.

$Z^8$ is a halogen atom, a nitro group, a cyano group, an amino group, an aldehyde group, a hydroxyl group, a thiol group, a sulfonic acid group, a carboxylic acid group, or an alkyl group of 1 to 20 carbon atoms, alkenyl group of 2 to 20 carbon atoms or alkynyl group of 2 to 20 carbon atoms which may be substituted with $Z^9$.

$Z^9$ is a halogen atom, a nitro group, a cyano group, an amino group, an aldehyde group, a hydroxyl group, a thiol group, a sulfonic acid group or a carboxylic acid group.

The halogen atoms, alkyl groups, alkenyl groups, alkynyl groups, aryl groups and heteroaryl groups of $R^{11}$ to $R^{12}$ and $Y^2$ to $Y^{13}$ are exemplified in the same way as above.

Of these, $R^{11}$ and $R^{12}$ are preferably hydrogen atoms or alkyl groups of 1 to 20 carbon atoms which may be substituted with $Z^7$, more preferably hydrogen atoms or methyl groups which may be substituted with $Z^7$, and most preferably both hydrogen atoms.

L, which represents the number of divalent alkylene group recurring units represented as —$(CR^{11}R^{12})$—, is an integer from 1 to 20, preferably from 1 to 10, more preferably from 1 to 5, even more preferably 1 or 2, and most preferably 1.

[Chemical Formula 1]

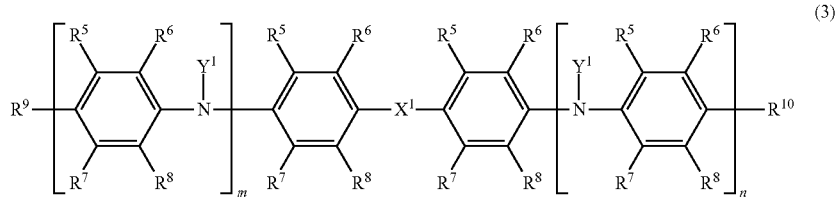

(3)

In formula (3), $X^1$ is —$NY^1$—, —O—, —S—, —$(CR^{11}R^{12})_L$— or a single bond; when m or n is 0, $X^1$ is —$NY^1$—.

Each $Y^1$ is independently a hydrogen atom, an alkyl group of 1 to 20 carbon atoms, alkenyl group of 2 to 20 carbon atoms or alkynyl group of 2 to 20 carbon atoms which may be substituted with $Z^7$, or an aryl group of 6 to 20 carbon atoms or heteroaryl group of 2 to 20 carbon atoms which may be substituted with $Z^8$.

The alkyl, alkenyl, alkynyl, aryl and heteroaryl groups are exemplified in the same way as above.

$R^{11}$ and $R^{12}$ are each independently a hydrogen atom, a halogen atom, a nitro group, a cyano group, an amino group, an aldehyde group, a hydroxyl group, a thiol group, a sulfonic acid group, a carboxylic acid group, an alkyl group of 1 to 20 carbon atoms, alkenyl group of 2 to 20 carbon atoms or alkynyl group of 2 to 20 carbon atoms which may When L is 2 or more, the plurality of $R^{11}$ groups may be mutually the same or different, and the plurality of $R^{12}$ groups may be mutually the same or different.

In particular, $X^1$ is preferably —$NY^1$— or a single bond. $Y^1$ is preferably a hydrogen atom or an alkyl group of 1 to 20 carbon atoms which may be substituted with $Z^7$, more preferably a hydrogen atom or a methyl group which may be substituted with $Z^7$, and most preferably a hydrogen atom.

$R^5$ to $R^8$ are each independently a hydrogen atom, a halogen atom, a nitro group, a cyano group, an amino group, an aldehyde group, a hydroxyl group, a thiol group, a sulfonic acid group, a carboxylic acid group, an alkyl group of 1 to 20 carbon atoms, alkenyl group of 2 to 20 carbon atoms or alkynyl group of 2 to 20 carbon atoms which may be substituted with $Z^7$, an aryl group of 6 to 20 carbon atoms or heteroaryl group of 2 to 20 carbon atoms which may be substituted with $Z^8$, or —$NHY^2$, —$NY^3Y^4$, —$C(O)Y^5$, —OY$^6$, —SY$^7$, —SO$_3$Y$^8$, —C(O)OY$^9$, —OC(O)Y$^{10}$, —C(O)NHY$^{11}$ or —C(O)NY$^{12}$Y$^{13}$ (wherein Y$^2$ to Y$^{13}$ are as defined above). These halogen atoms, alkyl groups, alkenyl groups, alkynyl groups, aryl groups and heteroaryl groups are as defined above.

In particular, in formula (3), R$^5$ to R$^8$ are preferably hydrogen atoms, halogen atoms, alkyl groups of 1 to 10 carbon atoms which may be substituted with Z$^7$, or aryl groups of 6 to 14 carbon atoms which may be substituted with Z$^8$; more preferably hydrogen atoms, fluorine atoms, or alkyl groups of 1 to 10 carbon atoms which may be substituted with fluorine atoms; and most preferably all hydrogen atoms.

R$^9$ and R$^{10}$ are preferably hydrogen atoms, halogen atoms, alkyl groups of 1 to 10 carbon atoms which may be substituted with Z$^7$, aryl groups of 6 to 14 carbon atoms which may be substituted with Z$^8$, or diphenylamino groups which may be substituted with Z$^8$ (—NY$^3$Y$^4$ groups wherein Y$^3$ and Y$^4$ are phenyl groups which may be substituted with Z$^8$); more preferably hydrogen atoms, fluorine atoms, or diphenylamino groups which may be substituted with fluorine atoms; and even more preferably both hydrogen atoms or both diphenylamino groups.

Of these, combinations in which R$^5$ to R$^8$ are hydrogen atoms, fluorine atoms or alkyl groups of 1 to 10 carbon atoms which may be substituted with fluorine atoms, R$^9$ and R$^{10}$ are hydrogen atoms, fluorine atoms or diphenylamino groups which may be substituted with fluorine atoms, X$^1$ is —NY$^1$— or a single bond, and Y$^1$ is a hydrogen atom or a methyl group are preferred. Combinations in which R$^5$ to R$^8$ are hydrogen atoms, R$^9$ and R$^{10}$ are both hydrogen atoms or diphenylamino groups, and X$^1$ is —NH— or a single bond are more preferred.

In formula (3), m and n independently represent an integer of 0 or more and satisfy the condition 1≤m+n≤20. Taking into account the balance between the charge transportability of the resulting thin-film and the solubility of the aniline derivative, m and n preferably satisfy the condition 2≤m+n≤8, more preferably satisfy the condition 2≤m+n≤6, and still more preferably satisfy the condition 2≤m+n≤4.

In particular, in Y$^1$ to Y$^{13}$ and R$^5$ to R$^{12}$, the substituent Z$^7$ is preferably a halogen atom or an aryl group of 6 to 20 carbon atoms which may be substituted with Z$^9$, more preferably a halogen atom or a phenyl group which may be substituted with Z$^9$, and most preferably does not exist (i.e., is non-substituting).

The substituent Z$^8$ is preferably a halogen atom or an alkyl group of 1 to 20 carbon atoms which may be substituted with Z$^9$, more preferably a halogen atom or an alkyl group of 1 to 4 carbon atoms which may be substituted with Z$^9$, and most preferably does not exist (i.e., is non-substituting).

Also, the substituent Z$^9$ is preferably a halogen atom, more preferably fluorine, and most preferably does not exist (i.e., is non-substituting).

In Y$^1$ to Y$^{13}$ and R$^5$ to R$^{12}$, the number of carbon atoms on the alkyl, alkenyl and alkynyl groups is preferably 10 or less, more preferably 6 or less, and even more preferably 4 or less.

The number of carbons on the aryl and heteroaryl groups is preferably 14 or less, more preferably 10 or less, and even more preferably 6 or less.

The aniline derivative has a molecular weight which is generally from 300 to 5,000. However, from the standpoint of increasing its solubility, the molecular weight is preferably not more than 4,000, more preferably not more than 3,000, and even more preferably not more than 2,000.

Examples of methods for synthesizing the aniline derivative include, but are not particularly limited to, the methods described in *Bulletin of Chemical Society of Japan*, 67, pp. 1749-1752 (1994); *Synthetic Metals*, 84, pp. 119-120 (1997); *Thin Solid Films*, 520 (24), pp. 7157-7163 (2012), International Disclosure WO 2008/032617, International Disclosure WO 2008/032616, International Disclosure WO 2008/129947 and International Disclosure WO 2013/084664.

Examples of aniline derivatives of formula (3) include, but are not limited to, phenyldianilines, phenyltrianilines, phenyltetraanilines, phenylpentaanilines, tetraanilines (aniline tetramers), octaanilines (aniline octamers), hexadecaanilines (aniline 16-mers), and those represented by the following formulas.

[Chemical Formula 2]

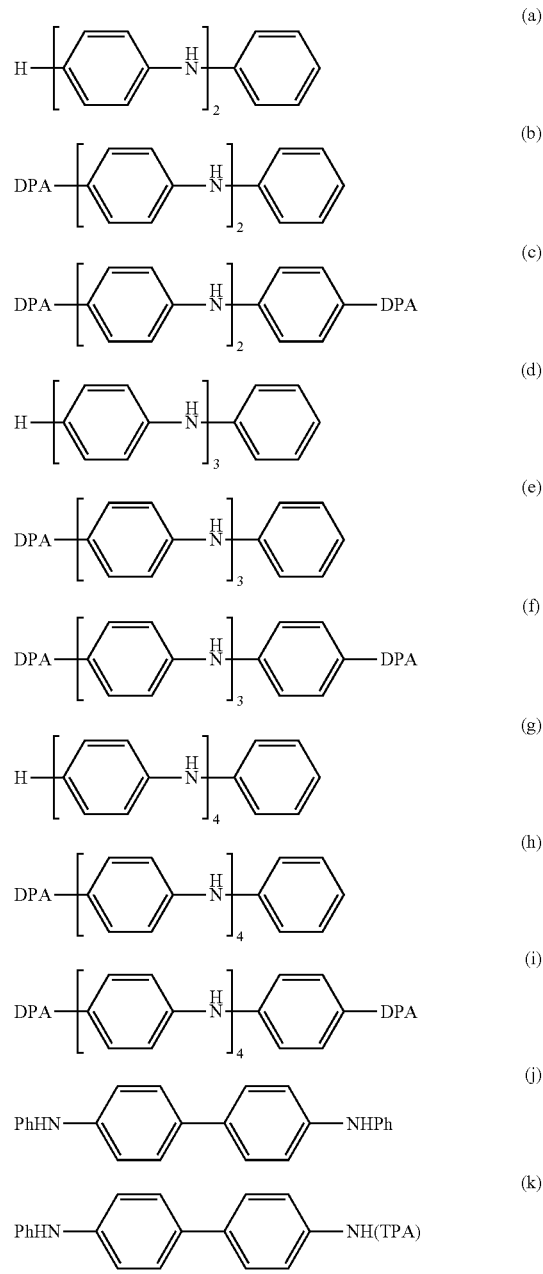

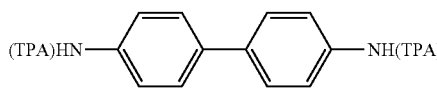
(I)

In these formulas, Ph stands for a phenyl group, DPA stands for a diphenylamino group, and TPA stands for a 4-(diphenylamino)phenyl group.

Various compounds hitherto commonly used as hole-transporting materials may be used as the charge-transporting substance.

Specific examples of hole-transporting low-molecular-weight materials include triarylamines such as (triphenylamine) dimer derivatives, [(triphenylamine) dimer] spirodimer, N,N'-bis(naphthalen-1-yl)-N,N'-bis(phenyl)benzidine (α-NPD), N,N'-bis(naphthalen-2-yl)-N,N'-bis(phenyl)benzidine, N,N'-bis(3-methylphenyl)-N,N'-bis(phenyl)benzidine, N,N'-bis(3-methylphenyl)-N,N'-bis(phenyl)-9,9-spirobifluorene, N,N'-bis(naphthalen-1-yl)-N,N'-bis(phenyl)-9,9-spirobifluorene, N,N'-bis(3-methylphenyl)-N,N'-bis(phenyl)-9,9-dimethylfluorene, N,N'-bis(naphthalen-1-yl)-N,N'-bis(phenyl)-9,9-dimethylfluorene, N,N'-bis(3-methylphenyl)-N,N'-bis(phenyl)-9,9-diphenylfluorene, N,N'-bis(naphthalen-1-yl)-N,N'-bis(phenyl)-9,9-diphenylfluorene, N,N'-bis(naphthalen-1-yl)-N,N'-bis(phenyl)-2,2'-dimethylbenzidine, 2,2',7,7'-tetrakis(N,N-diphenylamino)-9,9-spirobifluorene, 9,9-bis[4-(N,N-bisbiphenyl-4-ylamino)phenyl]-9H-fluorene, 9,9-bis[4-(N,N-bisnaphthalen-2-ylamino)phenyl]-9H-fluorene, 9,9-bis[4-(N-naphthalen-1-yl-N-phenylamino)phenyl]-9H-fluorene, 2,2',7,7'-tetrakis[N-naphthalenyl(phenyl)amino]-9,9-spirobifluorene, N,N'-bis(phenanthren-9-yl)-N,N'-bis(phenyl)benzidine, 2,2'-bis[N,N-bis(biphenyl-4-yl)amino]-9,9-spirobifluorene, 2,2'-bis(N,N-diphenylamino)-9,9-spirobifluorene, di[4-(N,N-di(p-tolyl)amino)phenyl]cyclohexane, 2,2',7,7'-tetra(N,N-di(p-tolyl))amino-9,9-spirobifluorene, N,N,N',N'-tetranaphthalen-2-ylbenzidine, N,N,N',N'-tetra(3-methylphenyl)-3,3'-dimethylbenzidine, N,N'-di(naphthalenyl)-N,N'-di(naphthalen-2-yl)benzidine, N,N,N',N'-tetra(naphthalenyl)benzidine, N,N'-di(naphthalen-2-yl)-N,N'-diphenylbenzidine-1-4-diamine, $N^1,N^4$-diphenyl-$N^1,N^4$-di(m-tolyl)benzene-1,4-diamine, $N^2,N^2,N^6,N^6$-tetraphenylnaphthalene-2,6-diamine, tris(4-(quinolin-8-yl)phenyl)amine, 2,2'-bis(3-(N,N-di(p-tolyl)amino)phenyl)biphenyl, 4,4',4"-tris[3-methylphenyl(phenyl)amino]triphenylamine (m-MTDATA) and 4,4',4"-tris[1-naphthyl(phenyl)amino]triphenylamine (1-TNATA); and oligothiophenes such as 5,5"-bis-{4-[bis(4-methylphenyl)amino]phenyl}-2,2':5',2"-terthiophene (BMA-3T).

Specific examples of hole-transporting polymer materials include poly[(9,9-dihexylfluorenyl-2,7-diyl)-co-(N,N'-bis{p-butylphenyl}-1,4-diaminophenylene)], poly[(9,9-dioctylfluorenyl-2,7-diyl)-co-(N,N'-bis{p-butylphenyl}-1,1'-biphenylene-4,4-diamine)], poly[(9,9-bis{1'-penten-5'-yl}fluorenyl-2,7-diyl)-co-(N,N'-bis{p-butylphenyl}-1,4-diaminophenylene)], poly[N,N'-bis(4-butylphenyl)-N,N'-bis(phenyl)benzidine] end-capped with polysilsesquioxane and poly[(9,9-dioctylfluorenyl-2,7-diyl)-co-(4,4'-(N-(p-butylphenyl))diphenylamine)].

Suitable use can also be made of the aniline derivatives disclosed in International Disclosure WO 2015/050253.

The content of the charge-transporting substance in the varnish of the invention is preferably about 0.1 to 20 wt % based on the overall varnish.

Depending on the intended use for the resulting thin-film, a dopant substance may be included in the charge-transporting varnish of the invention so as to, for example, increase the charge transportability of the thin-film.

The dopant substance is not particularly limited, provided it dissolves in at least one of the solvents used in the varnish. Use may be made of either an inorganic dopant substance or an organic dopant substance.

Examples of inorganic dopant substances include heteropolyacids such as phosphomolybdic acid, silicomolybdic acid, phosphotungstic acid, phosphotungstomolybdic acid and silicotungstic acid; strong inorganic acids such as hydrogen chloride, sulfuric acid, nitric acid and phosphoric acid; metal halides such as aluminum(III) chloride ($AlCl_3$), titanium(IV) tetrachloride ($TiCl_4$), boron tribromide ($BBr_3$), a boron trifluoride-ether complex ($BF_3.OEt_2$), iron(III) chloride ($FeCl_3$), copper(II) chloride ($CuCl_2$), antimony(V) pentachloride ($SbCl_5$), arsenic(V) pentafluoride ($AsF_5$) and phosphorus pentafluoride ($PF_5$); and halogens such as $Cl_2$, $Br_2$, $I_2$, ICl, $ICl_3$, IBr and $IF_4$.

Examples of organic dopant substances include tetracyanoquinodimethanes such as 7,7,8,8-tetracyanoquinodimethane (TCNQ), 2-fluoro-7,7,8,8-tetracyanoquinodimethane and 2,5-difluoro-7,7,8,8-tetracyanoquinodimethane; halotetracyanoquinodimethanes (halo-TCNQ's) such as tetrafluoro-7,7,8,8-tetracyanoquinodimethane (F4TCNQ), tetrachloro-7,7,8,8-tetracyanoquinodimethane, 2-fluoro-7,7,8,8-tetracyanoquinodimethane, 2-chloro-7,7,8,8-tetracyanoquinodimethane, 2,5-difluoro-7,7,8,8-tetracyanoquinodimethane and 2,5-dichloro-7,7,8,8-tetracyanoquinodimethane; benzoquinone derivatives such as tetrachloro-1,4-benzoquinone (chloranil) and 2,3-dichloro-5,6-dicyano-1,4-benzoquinone (DDQ); aromatic sulfone compounds, including arylsulfonic acid compounds such as benzenesulfonic acid, tosylic acid, p-styrenesulfonic acid, 2-naphthalenesulfonic acid, 4-hydroxybenzenesulfonic acid, 5-sulfosalicyclic acid, p-dodecylbenzenesulfonic acid, dihexylbenzenesulfonic acid, 2,5-dihexylbenzenesulfonic acid, dibutylnaphthalenesulfonic acid, 6,7-dibutyl-2-naphthalenesulfonic acid, dodecylnaphthalenesulfonic acid, 3-dodecyl-2-naphthalenesulfonic acid, hexylnaphthalenesulfonic acid, 4-hexyl-1-naphthalenesulfonic acid, octylnaphthalenesulfonic acid, 2-octyl-1-naphthalenesulfonic acid, hexylnaphthalenesulfonic acid, 7-hexyl-1-naphthalenesulfonic acid, 6-hexyl-2-naphthalenesulfonic acid, dinonylnaphthalenesulfonic acid, 2,7-dinonyl-4-naphthalenesulfonic acid, dinonylnaphthalenedisulfonic acid, 2,7-dinonyl-4,5-naphthalenedisulfonic acid, the 1,4-benzodioxanedisulfonic acid derivatives mentioned in International Disclosure WO 2005/000832, the arylsulfonic acid derivatives mentioned in International Disclosure WO 2006/025342 and the dinonylnaphthalenesulfonic acid derivatives mentioned in JP-A 2005-108828, and also polystyrenesulfonic acids; and non-aromatic sulfone compounds such as 10-camphorsulfonic acid.

These inorganic and organic dopant substances may be used singly or two or more may be used in combination.

Organic acids that may be used when preparing the charge-transporting varnish are not particularly limited, provided they have the ability to dissolve the ingredients used in the varnish. The organic solvent used may be suitably selected, in accordance with considerations such as the type of charge-transporting substance used, from among, for example, aromatic or halogenated aromatic hydrocarbon solvents such as benzene, toluene, xylene, ethylbenzene and chlorobenzene; aliphatic hydrocarbons such as n-heptane, n-hexane and cyclohexane; ether solvents such as diethyl ether, tetrahydrofuran, dioxane and 1,2-dimethoxyethane; ketone solvents such as acetone, methyl ethyl ketone, methyl isobutyl ketone and cyclohexanone; ester solvents such as ethyl acetate, n-hexyl acetate, ethyl lactate and γ-butyrolactone; halogenated hydrocarbon solvents such as methylene chloride, dichloromethane, 1,2-dichloroethane and chloroform; amide solvents such as N,N-dimethylformamide, N,N-dimethylacetamide, N-methyl-2-pyrrolidone and 1,3-dimethyl-2-imidazolidinone; alcohol solvents such as methanol, ethanol, isopropanol, n-propanol, cyclohexanol and diacetone alcohol; glycol ether solvents such as ethylene glycol monoethyl ether, ethylene glycol monobutyl ether, ethylene glycol diglycidyl ether, propylene glycol monomethyl ether, diethylene glycol monomethyl ether, diethylene glycol monoethyl ether, diethylene glycol diethyl ether, diethylene glycol dimethyl ether, diethylene glycol monoethyl ether acetate, diethylene glycol monobutyl ether acetate, dipropylene glycol monomethyl ether and propylene glycol monomethyl ether acetate; and glycol solvents such as ethylene glycol, propylene glycol, hexylene glycol, 1,3-octylene glycol, diethylene glycol, dipropylene glycol, triethylene glycol, tripropylene glycol, 1,3-butanediol, 2,3-butanediol and 1,4-butanediol.

These organic solvents may be used singly, or two or more may be used in admixture.

The viscosity of the inventive varnish is set as appropriate for the thickness and other properties of the thin-film to be produced and for the solids concentration of the varnish, but is generally from 1 to 50 mPa·s at 25° C.

The solids concentration of the charge-transporting varnish of the invention is set as appropriate based on such considerations as the viscosity, surface tension and other properties of the varnish and the thickness and other properties of the thin-film to be produced, and is generally from about 0.1 to about 10.0 wt %. To improve the coating properties of the varnish, the solids concentration of the varnish is preferably about 0.5 to 5.0 wt %, and more preferably about 1.0 to 3.0 wt %. Here, "solids" refers to the charge transporting substance and dopant substance included in the charge-transporting varnish of the invention.

A charge-transporting thin-film can be formed on a substrate by coating the charge-transporting varnish described above onto the substrate and baking.

Examples of the varnish coating method include, but are not particularly limited to, dipping, spin coating, transfer printing, roll coating, brush coating, inkjet printing, spraying and slit coating. The viscosity and surface tension of the varnish are preferably adjusted in accordance to the coating method to be used.

When using the varnish of the invention, the baking atmosphere is not particularly limited. A thin-film having a uniform film surface and high charge transportability can be obtained not only in an open-air atmosphere, but even in an inert gas such as nitrogen or in a vacuum.

The baking temperature is suitably set in the range of about 100 to 260° C. while taking into account such factors as the intended use of the resulting thin-film, the degree of charge transportability to be imparted to the thin-film, and the type and boiling point of the solvent. When the resulting thin-film is to be used as a hole injection layer in an organic EL device, the baking temperature is preferably about 140 to 250° C., and more preferably about 145 to 240° C.

During baking, a temperature change in two or more steps may be applied for such purposes as to achieve more uniform film formability or to induce the reaction to proceed on the substrate. Heating may be carried out using a suitable apparatus such as a hot plate or an oven.

The thickness of the charge-transporting thin-film is not particularly limited. However, when the thin-film is to be used as a hole injection layer or a hole-transporting layer in an organic EL device, a film thickness of 5 to 200 nm is preferred. Methods for changing the film thickness include, for example, changing the solids concentration in the varnish and changing the amount of solution on the substrate during coating.

The charge-transporting varnish of the invention includes a specific organosilane compound. As a result, the thin-film obtained using the varnish also includes a specific organosilane compound, and so the ionization potential of the thin-film is deeper than when a varnish not containing the organosilane compound is used. This specific silane compound can thus be regarded as having an ionization potential-deepening action on charge-transporting thin-films containing a charge-transporting substance.

Therefore, by employing the charge-transporting thin-film of the invention in a hole injection layer or a hole-transporting layer of an organic EL device, and preferably a hole-transporting layer, the charge-transporting barrier between this thin-film and the functional thin-film stacked on the cathode side thereof becomes smaller, enabling the brightness characteristics of the organic EL device to be improved.

The materials and method employed to fabricate an OLED device using the charge-transporting varnish of the invention are exemplified by, but not limited to, those described below.

The electrode substrate to be used is preferably cleaned beforehand by liquid washing with, for example, a cleaning agent, alcohol or pure water. When the substrate is an anode substrate, it is preferably subjected to surface treatment such as UV/ozone treatment or oxygen-plasma treatment just prior to use. However, surface treatment need not be carried out if the anode material is composed primarily of organic substances.

An example of a method of fabricating an OLED device in which a thin-film obtained from the charge-transporting varnish of the invention serves as a hole-transporting layer is described below.

In this method, a hole-transporting layer is formed on an electrode by coating the charge-transporting varnish of the invention onto an anode substrate or, where necessary, onto a hole injection layer that has been provided on an anode substrate, and then baking. The coated substrate is introduced into a vacuum deposition system, and an emissive layer, electron-transporting layer, electron-transporting layer/hole-blocking layer and cathode metal are vapor-deposited thereon in this order, thereby fabricating an OLED device. Where necessary, an electron-blocking layer may be provided between the emissive layer and the hole-transporting layer.

Illustrative examples of anode materials include transparent electrodes such as indium-tin oxide (ITO) and indium-zinc oxide (IZO), and metal anodes made of a metal such as aluminum or an alloy of such a metal. An anode material on which planarizing treatment has been carried out is preferred. Use can also be made of polythiophene derivatives and polyaniline derivatives having a high charge transportability.

Examples of other metals making up the metal anode include, but are not limited to, scandium, titanium, vanadium, chromium, manganese, iron, cobalt, nickel, copper, zinc, gallium, yttrium, zirconium, niobium, molybdenum, ruthenium, rhodium, palladium, cadmium, indium, scandium, lanthanum, cerium, praseodymium, neodymium, promethium, samarium, europium, gadolinium, terbium, dysprosium, holmium, erbium, thulium, ytterbium, hafnium, thallium, tungsten, rhenium, osmium, iridium, platinum, gold, titanium, lead, bismuth, and alloys thereof.

Specific examples of emissive layer-forming materials include tris(8-quinolinolate) aluminum(III) (Alq$_3$), bis(8-quinolinolate) zinc(II) (Znq$_2$), bis(2-methyl-8-quinolinolate)-(p-phenylphenolate) aluminum(III) (BAlq), 4,4'-bis(2,2-diphenylvinyl)biphenyl, 9,10-di(naphthalen-2-yl) anthracene, 2-t-butyl-9,10-di(naphthalen-2-yl)anthracene, 2,7-bis[9,9-di(4-methylphenyl)fluoren-2-yl]-9,9-di(4-methylphenyl)fluorene, 2•methyl-9,10-bis(napthalen-2-yl)anthracene, 2-(9,9-spirobifluoren-2-yl)-9,9-spirobifluorene, 2,7-bis(9,9-spirobifluoren-2-yl)-9,9-spirobifluorene, 2-[9,9-di(4-methylphenyl)fluoren-2-yl]-9,9-di(4-methylphenyl) fluorene, 2,2'-dipyrenyl-9,9-spirobifluorene, 1,3,5-tris (pyren-1-yl)benzene, 9,9-bis[4-(pyrenyl)phenyl]-9H-fluorene, 2,2'-bi(9,10-diphenylanthracene), 2,7-dipyrenyl-9,9-spirobifluorene, 1,4-di(pyren-1-yl)benzene, 1,3-di(pyren-1-yl)benzene, 6,13-di(biphenyl-4-yl)pentacene, 3,9-di (naphthalen-2-yl)perylene, 3,10-di(naphthalen-2-yl) perylene, tris[4-(pyrenyl)phenyl]amine, 10,10'-di(biphenyl-4-yl)-9,9'-bianthracene, N,N'-di(naphthalen-1-yl)-N,N'-diphenyl[1,1':4',1":4",1'''-quaterphenyl]-4,4'''-diamine, 4,4'-di[10-(naphthalen-1-yl)anthracen-9-yl]biphenyl, dibenzo{[f,f']-4,4',7,7'-tetraphenyl}diindeno[1,2,3-cd:1',2',3'-1m] perylene, 1-(7-(9,9'-bianthracen-10-yl)-9,9-dimethyl-9H-fluoren-2-yl)pyrene, 1-(7-(9,9'-bianthracen-10-yl)-9,9-dihexyl-9H-fluoren-2-yl)pyrene, 1,3-bis(carbazol-9-yl) benzene, 1,3,5-tris(carbazol-9-yl)benzene, 4,4',4"-tris (carbazol-9-yl)triphenylamine, 4,4'-bis(carbazol-9-yl) biphenyl (CBP), 4,4'-bis(carbazol-9-yl)-2,2'-dimethylbiphenyl, 2,7-bis(carbazol-9-yl)-9,9-dimethylfluorene, 2,2',7,7'-tetrakis(carbazol-9-yl)-9,9-spirobifluorene, 2,7-bis(carbazol-9-yl)-9,9-di(p-tolyl) fluorene, 9,9-bis[4-(carbazol-9-yl)phenyl]fluorene, 2,7-bis (carbazol-9-yl)-9,9-spirobifluorene, 1,4-bis(triphenylsilyl) benzene, 1,3-bis(triphenylsilyl)benzene, bis(4-N,N-diethylamino-2-methylphenyl)-4-methylphenylmethane, 2,7-bis(carbazol-9-yl)-9,9-dioctylfluorene, 4,4"-di(triphenylsilyl)-p-terphenyl, 4,4'-di(triphenylsilyl)biphenyl, 9-(4-t-butylphenyl)-3,6-bis(triphenylsilyl)-9H-carbazole, 9-(4-t-butylphenyl)-3,6-ditrityl-9H-carbazole, 9-(4-t-butylphenyl)-3,6-bis(9-(4-methoxyphenyl)-9H-fluoren-9-yl)-9H-carbazole, 2,6-bis(3-(9H-carbazol-9-yl)phenyl)pyridine, triphenyl(4-(9-phenyl-9H-fluoren-9-yl)phenyl)silane, 9,9-dimethyl-N,N-diphenyl-7-(4-(1-phenyl-1H-benzo[d]imidazol-2-yl)phenyl-9H-fluoren-2-amine, 3,5-bis(3-(9H-carbazol-9-yl)phenyl)pyridine, 9,9-spirobifluoren-2-yldiphenylphosphine oxide, 9,9'-(5-triphenylsilyl)-1,3-phenylene)bis(9H-carbazole), 3-(2,7-bis (diphenylphosphoryl)-9-phenyl-9H-fluoren-9-yl)-9-phenyl-9H-carbazole, 4,4,8,8,12,12-hexa(p-tolyl)-4H-8H-12H-12C-azadibenzo[cd,mn]-pyrene, 4,7-di(9H-carbazol-9-yl)-1,10-phenanthroline, 2,2'-bis(4-(carbazol-9-yl)phenyl) biphenyl, 2,8-bis(diphenylphosphoryl)dibenzo[b,d] thiophene, bis(2-methylphenyl)diphenylsilane, bis[3,5-di (9H-carbazol-9-yl)phenyl]diphenylsilane, 3,6-bis(carbazol-9-yl)-9-(2-ethylhexyl)-9H-carbazole, 3-(diphenylphosphoryl)-9-(4-(diphenylphosphoryl)phenyl)-9H-carbazole and 3,6-bis[(3,5-diphenyl)phenyl]-9-phenyl-carbazole.

The emissive layer may be formed by co-deposition of any of these materials with a light-emitting dopant.

Specific examples of light-emitting dopants include 3-(2-benzothiazolyl)-7-(diethylamino)coumarin, 2,3,6,7-tetrahydro-1,1,7,7-tetramethyl-1H,5H,11H-10-(2-benzothiazolyl)quinolidino[9,9a,1gh]coumarin, quinacridone, N,N'-dimethylquinacridone, tris(2-phenylpyridine) iridium(III) (Ir(ppy)$_3$), bis(2-phenylpyridine)(acetylacetonate) iridium (III) (Ir(ppy)$_2$(acac)), tris[2-(p-tolyl)pyridine] iridium(III) (Ir(mppy)$_3$), 9,10-bis[N,N-di(p-tolyl)amino]anthracene, 9,10-bis[phenyl(m-tolyl)amino]anthracene, bis[2-(2-hydroxyphenyl)benzothiazolate] zinc(II), $N^{10},N^{10},N^{10'},N^{10'}$-tetra(p-tolyl)-9,9'-bianthracene-10,10-diamine, $N^{10},N^{10},N^{10'},N^{10'}$-tetraphenyl-9,9-bianthracene-10,10'-diamine, $N^{10},N^{10'}$-diphenyl-$N^{10},N^{10'}$-dinaphthalenyl-9,9'-bianthracene-10,10'-diamine, 4,4'-bis(9-ethyl-3-carbazovinylene)-1,1'-biphenyl, perylene, 2,5,8,11-tetra-t-butylperylene, 1,4-bis[2-(3-N-ethylcarbazolyl)vinyl]benzene, 4,4'-bis[4-(di-p-tolylamino)styryl]biphenyl, 4-(di-p-tolylamino)-4'-[(di-p-tolylamino)styryl]stilbene, bis(3,5-difluoro)-2-(2-pyridyl) phenyl-(2-carboxypyridyl) iridium(III), 4,4'-bis[4-(diphenylamino)styryl]biphenyl, bis(2,4-difluorophenylpyridinato)tetrakis(1-pyrazolyl)borate iridium(III), N,N'-bis(naphthalen-2-yl)-N,N'-bis(phenyl)tris (9,9-dimethylfluorenylene), 2,7-bis{2-[phenyl(m-tolyl) amino]-9,9-dimethylfluoren-7-yl}-9,9-dimethylfluorene, N-(4-((E)-2-(6((E)-4-(diphenylamino)styryl)naphthalen-2-yl)vinyl)phenyl)-N-phenylbenzenamine, fac-iridium(III) tris(1-phenyl-3-methylbenzimidazolin-2-ylidene-C,C$^{2'}$), mer-iridium(III) tris(1-phenyl-3-methylbenzimidazolin-2-ylidene-C,C$^{2'}$), 2,7-bis[4-(diphenylamino)styryl]-9,9-spirobifluorene, 6-methyl-2-(4-(9-(4-(6-methylbenzo[d]thiazol-2-yl)phenyl)anthracen-10-yl)phenyl)benzo[d]thiazole, 1,4-di[4-(N,N-diphenyl)amino]styrylbenzene, 1,4-bis(4-(9H-carbazol-9-yl)styryl)benzene, (E)-6-(4-(diphenylamino) styryl)-N,N-diphenylnaphthalen-2-amine, bis(2,4-difluorophenylpyridinato)(5-(pyridin-2-yl)-1H-tetrazolate) iridium(III), bis(3-trifluoromethyl-5-(2-pyridyl)pyrazole) ((2,4-difluorobenzyl)diphenylphosphinate) iridium(III), bis (3-trifluoromethyl-5-(2-pyridyl)pyrazolate)(benzyl-diphenylphosphinate) iridium(III), bis(1-(2,4-difluorobenzyl)-3-methylbenzimidazolium)(3-(trifluoromethyl)-5-(2-pyridyl)-1,2,4-triazolate) iridium(III), bis(3-trifluoromethyl-5-(2-pyridyl)pyrazolate)(4',6'-difluorophenylpyridinate) iridium (III), bis(4',6'-difluorophenylpyridinato)(3,5-bis (trifluoromethyl)-2-(2'-pyridyl)pyrrolate) iridium(III), bis (4',6'-difluorophenylpyridinato)(3-(trifluoromethyl)-5-(2-pyridyl)-1,2,4-triazolate) iridium (III), (Z)-6-mesityl-N-(6-mesitylquinolin-2(1H)-ylidene)quinolin-2-amine-BF$_2$, (E)-2-(2-(4-(dimethylamino)styryl)-6-methyl-4H-pyran-4-ylidene)malononitrile, 4-(dicyanomethylene)-2-methyl-6-julolidyl-9-enyl-4-H-pyran, 4-(dicyanomethylene)-2-methyl-6-(1,1,7,7-tetramethyl-julolidyl-9-enyl)-4H-pyran, 4-(dicyanomethylene)-2-t-butyl-6-(1,1,7,7-tetramethyl-julolidin-4-ylvinyl)-4H-pyran, tris(dibenzoylmethane) phenanthroline europium(III), 5,6,11,12-tetraphenylnaphthacene, bis(2-benzo[b]thiophen-2-yl-pyridine) (acetylacetonate) iridium(III), tris(1-phenylisoquinoline) iridium(III), bis(1-phenylisoquinoline)(acetylacetonate) iridium(III), bis[1-(9,9-dimethyl-9H-fluoren-2-yl)isoquinoline]-(acetylacetonate) iridium(III), bis[2-(9,9-dimethyl-9H-fluoren-2-yl)quinoline]-(acetylacetonate) iridium(III), tris[4,4'-di-t-butyl-(2,2')-bipyridine] ruthenium(III)•bis (hexafluorophosphate), tris(2-phenylquinoline) iridium(III), bis(2-phenylquinoline)(acetylacetonate) iridium(III), 2,8-di-t-butyl-5,11-bis(4-t-butylphenyl)-6,12-diphenyltetracene, bis(2-phenylbenzothiazolate)(acetylacetonate) iridium(III), platinum 5,10,15,20-tetraphenyltetrabenzoporphyrin, osmium(II) bis(3-trifluoromethyl-5-(2-pyridine)pyrazolate)-dimethylphenylphosphine, osmium(II) bis(3-trifluoromethyl)-5-(4-t-butylpyridyl)-1,2,4-triazolate) diphenylmethylphosphine, osmium(II) bis(3-(trifluoromethyl)-5-(2-pyridyl)-1,2,4-triazole) dimethylphenylphosphine, osmium(II) bis(3-(trifluoromethyl)-5-(4-t-butylpyridyl)-1,2,4-triazolate) dimethylphenylphosphine, bis[2-(4-n-hexylphenyl)quinoline](acetylacetonate) iridium(III), tris[2-(4-n-hexylphenyl)quinoline] iridium(III), tris[2-phenyl-4-methylquinoline] iridium(III), bis(2-phenylquinoline)(2-(3-methylphenyl)pyridinate) iridium(III), bis(2-(9,9-diethylfluoren-2-yl)-1-phenyl-1H-benzo[d]-imidazolato) (acetylacetonate) iridium(III), bis(2-phenylpyridine)(3-(pyridin-2-yl)-2H-chromen-9-onate) iridium(III), bis(2-phenylquinoline)(2,2,6,6-tetramethylheptane-3,5-dionate) iridium(III), bis(phenylisoquinoline)(2,2,6,6-tetramethyl-heptane-3,5-dionate) iridium(III), iridium(III) bis(4-phenylthieno[3,2-c]pyridinato-N,$C^2$)-acetylacetonate, (E)-2-(2-t-butyl-6-(2-(2,6,6-trimethyl-2,4,5,6-tetrahydro-1H-pyrrolo [3,2,1-ij]quinolin-8-yl)vinyl)-4H-pyran-4-ylidene)-malononitrile, bis(3-trifluoromethyl-5-(1-isoquinolyl) pyrazolate)(methyl-diphenylphosphine) ruthenium, bis[(4-n-hexylphenyl)isoquinoline](acetylacetonate) iridium(III), platinum(II) octaethylporphin, bis(2-methyldibenzo[f,h]quinoxaline)(acetylacetonate) iridium(III) and tris[(4-n-hexylphenyl)isoquinoline] iridium(III).

Specific examples of electron transport layer/hole blocking layer-forming materials include lithium 8-hydroxyquinolinolate, 2,2',2"-(1,3,5-benzinetriyl)-tris(1-phenyl-1-H-benzimidazole), 2-(4-biphenyl)-5-(4-t-butylphenyl)-1,3,4-oxadiazole, 2,9-dimethyl-4,7-diphenyl-1,10-phenanthroline, 4,7-diphenyl-1,10-phenanthroline, bis(2-methyl-8-quinolinolate)-4-(phenylphenolato)aluminum, 1,3-bis[2-(2,2'-bipyridin-6-yl)-1,3,4-oxadiazo-5-yl]benzene, 6,6'-bis[5-(biphenyl-4-yl)-1,3,4-oxadiazo-2-yl]-2,2'-bipyridine, 3-(4-biphenyl)-4-phenyl-5-t-butylphenyl-1,2,4-triazole, 4-(naphthalen-1-yl)-3,5-diphenyl-4H-1,2,4-triazole, 2,9-bis(naphthalen-2-yl)-4,7-diphenyl-1,10-phenanthroline, 2,7-bis[2-(2,2'-bipyridin-6-yl)-1,3,4-oxadiazo-5-yl]-9,9-dimethylfluorene, 1,3-bis[2-(4-t-butylphenyl)-1,3,4-oxadiazo-5-yl] benzene, tris(2,4,6-trimethyl-3-(pyridin-3-yl)phenyl) borane, 1-methyl-2-(4-(naphthalen-2-yl)phenyl)-1H-imidazo[4,5f][1,10]-phenanthroline, 2-(naphthalen-2-yl)-4,7-diphenyl-1,10-phenanthroline, phenyldipyrenylphosphine oxide, 3,3',5,5'-tetra[(m-pyridyl)phen-3-yl]biphenyl, 1,3,5-tris[(3-pyridyl)phen-3-yl]benzene, 4,4'-bis(4,6-diphenyl-1,3,5-triazin-2-yl)biphenyl, 1,3-bis[3,5-di(pyridin-3-yl)phenyl]benzene, bis(10-hydroxybenzo[h]quinolinato) beryllium, diphenylbis(4-(pyridin-3-yl)phenyl)silane and 3,5-di(pyren-1-yl)pyridine.

Examples of electron injection layer-forming materials include lithium oxide ($Li_2O$), magnesium oxide (MgO), alumina ($Al_2O_3$), lithium fluoride (LiF), sodium fluoride (NaF), magnesium fluoride ($MgF_2$), cesium fluoride (CsF), strontium fluoride ($SrF_2$), molybdenum trioxide ($MoO_3$), aluminum, Li(acac), lithium acetate and lithium benzoate.

Examples of cathode materials include aluminum, magnesium-silver alloys, aluminum-lithium alloys, lithium, sodium, potassium and cesium.

An example of an electron blocking layer-forming material is tris(phenylpyrazole)iridium.

The charge-transporting substance used in the hole-transporting layer is a compound selected from among the charge-transporting substances mentioned above, other than a hole-transporting polymer material.

The fabrication of polymer LED (PLED) devices using the charge-transporting varnish of the invention, although not particularly limited, is exemplified by the following method.

A PLED device having a hole-transporting polymer film formed using the charge-transporting varnish of the invention can be fabricated by, in the production of an OLED device as described above, forming a light-emitting polymer layer instead of carrying out vacuum deposition operations for an emissive layer, an electron-transporting layer and an electron injection layer.

Specifically, the charge-transporting varnish of the invention is coated onto an anode substrate, or onto a hole injection layer that has been optionally formed on an anode substrate, thus forming a hole-transporting layer by the above method. A light-emitting polymer layer is successively formed thereon, following which a cathode is vapor-deposited on top, thereby forming the PLED device.

The cathode and anode materials used here may be similar to those used when producing an OLED device as described above, and similar cleaning treatment and surface treatment may be carried out.

The method of forming the light-emitting polymer layer is exemplified by a film-forming method in which a solvent is added to a light-emitting polymer material, or to the material obtained by adding thereto a dopant substance, thereby dissolving or uniformly dispersing the material, following which the resulting solution or dispersion is coated onto the hole-transporting polymer layer and subsequently baked.

Examples of light-emitting polymer materials include polyfluorene derivatives such as poly(9,9-dialkylfluorene) (PDAF), poly(phenylene vinylene) derivatives such as poly(2-methoxy-5-(2'-ethylhexoxy)-1,4-phenylene vinylene) (MEH-PPV), polythiophene derivatives such as poly(3-alkylthiophene) (PAT), and polyvinylcarbazole (PVCz).

The hole-transporting polymer materials mentioned above may be used as the charge-transporting substance which is used in the hole-transporting layer.

Examples of the solvent include toluene, xylene and chloroform. Examples of the method of dissolution or uniform dispersion include stirring, stirring under applied heat, and ultrasonic dispersion.

The coating method is exemplified by, but not particularly limited to, inkjet printing, spraying, dipping, spin coating, transfer printing, roll coating and brush coating. Coating is preferably carried out in an inert gas atmosphere such as nitrogen or argon.

Examples of the baking method include methods that involve heating in an oven or on a hot plate, either within an inert gas atmosphere or in a vacuum.

EXAMPLES

Production Examples and Working Examples are given below to more concretely illustrate the invention, although the invention is not limited by these Examples. The equipment used was as follows.
(1) Molecular Weight Measurement:
Room-temperature gel permeation chromatography (GPC) system (GPC-101) and Shodex column (KD-803L), from Showa Denko K.K.
(Measurement Conditions)
Column temperature: 40° C.
Eluant: tetrahydrofuran (THF), 10 mL/L
Flow rate: 1.0 mL/min
Standard samples for constructing calibration curve: SL-105 and standard samples of polystyrene (molecular weights: approx. 580, 2,970, 7,200, 19,900 and 52,400), all products of Showa Denko K.K.

(2) ¹H-NMR Measurement:
  JNM-ECP300 FT NMR System, from JEOL, Ltd.
(3) Substrate Cleaning:
  Substrate cleaning machine (reduced-pressure plasma system), from Choshu Industry Co., Ltd.
(4) Varnish Coating:
  MS-A100 Spin Coater, from Mikasa Co., Ltd.
(5) Film Thickness Measurement:
  Surf corder ET-4000 microfigure measuring instrument, from Kosaka Laboratory, Ltd.
(6) EL Device Fabrication:
  C-E2L1G1-N Multifunction Vapor Deposition System, from Choshu Industry Co., Ltd.
(7) Measurement of EL Device Brightness:
  I-V-L Measurement System from Tech World, Inc.
(8) Measurement of Ionization Potential:
  AC-3 atmospheric-pressure photoelectron spectrophotometer, from Riken Keiki Co., Ltd.

[1] Synthesis of Compounds

[Synthesis Example 1] Synthesis of Organosilane Compound

An alkoxysilane monomer solution was prepared by mixing together 18.4 g of hexylene glycol, 6.1 g of butyl cellosolve, 23.3 g of tetraethoxysilane and 10.5 g of 3,3,3-trifluoropropyltrimethoxysilane in a 200 mL four-neck flask equipped with a thermometer and a reflux condenser.

A solution prepared beforehand by mixing together 9.2 g of hexylene glycol, 3.1 g of butyl cellosolve, 8.6 g of water and 0.7 g of oxalic acid as a catalyst was added dropwise over 30 minutes at room temperature to the alkoxysilane monomer solution. Next, refluxing was carried out for one hour by heating on an oil bath, after which the system was allowed to cool down, thereby giving a polysiloxane solution having a concentration ($SiO_2$ basis) of 12 wt %.

The resulting polysiloxane had a number-average molecular weight of 2,500 and a weight-average molecular weight of 3,500.

In addition, 10.0 g of the resulting polysiloxane solution, 42.0 g of hexylene glycol and 14.0 g of butyl cellosolve were mixed together to prepare a polysiloxane solution having a concentration ($SiO_2$ basis) of 5 wt %, and this polysiloxane solution was used to prepare a charge-transporting varnish.

[2] Preparation of Charge-Transporting Varnish

Working Example 1-1

A charge-transporting varnish was prepared by thoroughly mixing together, under a nitrogen atmosphere: 0.05 g of poly[(9,9-dihexylfluorenyl-2,7-diyl)-co-(N,N'-bis(p-butylphenyl)-1,4-diaminophenylene)] (ADS250BE, from American Dye Source, Inc.; the same applies below) as the charge-transporting polymer, 0.0151 g of the polysiloxane solution obtained in Synthesis Example 1, and 10 g of toluene.

Working Example 1-2

Aside from changing the amount of the charge-transporting polymer (ADS250BE) used to 0.0251 g, a charge-transporting varnish was prepared by the same method as in Working Example 1-1.

Comparative Example 1

A charge-transporting varnish was prepared by thoroughly mixing together 0.05 g of charge-transporting polymer (ADS250BE) and 10 g of toluene under a nitrogen atmosphere.

[3] Fabrication of Organic EL Devices and Evaluation of Device Characteristics

Working Example 2-1

First, under a nitrogen atmosphere, 0.165 g of the aniline derivative of formula (A1) synthesized according to the method described in International Disclosure WO 2013/084664 and 0.325 g of the arylsulfonic acid of formula (S1) synthesized according to the method described in International Disclosure WO 2006/025342 were dissolved in 8.0 g of 1,3-dimethyl-2-imidazolidinone. To this was added 12.0 g of cyclohexanol and 4.0 g of propylene glycol, followed by stirring, after which 0.016 g of 3,3,3-trifluoropropyltrimethoxysilane and 0.033 g of phenyltrimethoxysilane were dissolved therein and stirring was carried out, thereby giving a hole injection layer-forming varnish.

[Chemical Formula 3]

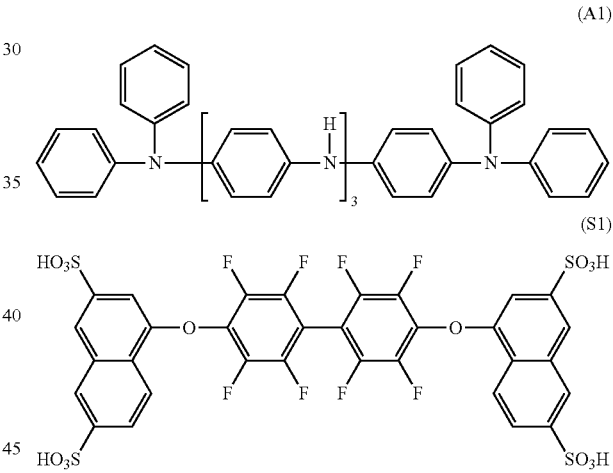

This varnish was coated onto an ITO substrate using a spin coater, then dried for 1 minute at 80° C. and subsequently baked for 15 minutes at 230° C. in an open-air atmosphere, thereby forming a uniform 30 nm thin-film (hole injection layer) on the ITO substrate. A glass substrate with dimensions of 25 mm×25 mm×0.7 mm (t) and having indium-tin oxide (ITO) patterned on the surface to a film thickness of 150 nm was used as the ITO substrate. Prior to use, impurities on the surface were removed with an $O_2$ plasma cleaning system (150 W, 30 seconds).

Next, the charge-transporting varnish obtained in Working Example 1-1 was coated using a spin coater onto the thin-film formed on the ITO substrate and subsequently baked for 10 minutes at 150° C. in an open-air atmosphere, thereby forming a uniform 30 nm thin-film (hole-transporting layer).

CBP and $Ir(PPy)_3$ were co-deposited thereon using a vapor deposition system (degree of vacuum, $1.0×10^{-5}$ Pa). In co-deposition, the vapor deposition rate was controlled so that the $Ir(PPy)_3$ concentration becomes 6%, and 40 nm was deposited. Next, thin-films of BAlq, lithium fluoride and aluminum were successively deposited, thereby giving an organic EL device. Vapor deposition was carried out at a rate of 0.2 nm/s for BAlq and aluminum, and at a rate of 0.02 nm/s for lithium fluoride. The film thicknesses were set to, respectively, 20 nm, 0.5 nm and 100 nm.

To prevent the device characteristics from deteriorating due to the influence of oxygen, moisture and the like in air, the organic EL device was sealed with sealing substrates, after which the device characteristics were evaluated. Sealing was carried out by the following procedure.

In a nitrogen atmosphere having an oxygen concentration of not more than 2 ppm and a dew point of not more than −85° C., the organic EL device was placed between sealing substrates and the sealing substrates were laminated together using an adhesive (MORESCO Moisture Cut WB90US(P), from Moresco Corporation). A desiccant (HD-071010W-40, from Dynic Corporation) was placed, together with the organic EL device, within the sealing substrates. The laminated sealing substrates were irradiated with UV light (wavelength, 365 nm; dosage, 6,000 mJ/cm$^2$), and then annealed at 80° C. for 1 hour to cure the adhesive.

Working Example 2-2, Comparative Example 2

Aside from using the varnish obtained in Working Example 1-2 or Comparative Example 1 instead of the varnish obtained in Working Example 1-1, organic EL devices were fabricated in the same way as in Working Example 2-1.

The current density, brightness and current efficiency at a driving voltage of 10 V were measured for these fabricated devices. The results are shown in Table 1. The size (area) of the light-emitting surface in each device was 2 mm×2 mm.

TABLE 1

|  | Current density (mA/cm$^2$) | Brightness (cd/m$^2$) | Current efficiency (cd/A) |
| --- | --- | --- | --- |
| Comparative Example 2 | 27.6 | 3,527 | 12.8 |
| Working Example 2-1 | 26.5 | 3,835 | 14.5 |
| Working Example 2-2 | 26.4 | 3,940 | 14.9 |

As shown in Table 1, organic EL devices containing a thin-film obtained from the charge-transporting varnish of the invention had excellent brightness characteristics and current efficiency.

[4] Measurement of Ionization Potential

Working Example 3-1

The varnish obtained in Working Example 1-1 was coated onto a 25 mm×25 mm×0.7 mm (t) glass substrate having a film of indium-tin oxide (ITO) formed thereon to a thickness of 150 nm and was subsequently baked for 10 minutes at 150° C. in an open-air atmosphere, thereby forming a uniform 30 nm thin-film. Prior to use, impurities on the surface of the substrate were removed with an O$_2$ plasma cleaning system (150 W, 30 seconds).

The ionization potential of the resulting thin-film was measured using an AC-3 atmospheric-pressure photoelectron spectrophotometer. The measurement method and the method of determining the ionization potential are described below.

First, compressed air (0.5 to 0.7 MPa) and compressed nitrogen (purity, ≥99.9%; pressure, 0.5 to 0.6 MPa) were fed into the main unit of the spectrometer, and the system was warmed up. The main unit was then connected to a computer, and the establishment of communications, initialization of the light intensity adjustor and setting of the detector voltage were carried out. Next, the light intensity was set to 20 nW and the light intensity correction coefficient in the energy range of 4.8 to 7.0 eV was measured. The sample was then inserted and, using the measured light intensity correction coefficient, the photoelectron yield in the energy range of 4.8 to 7.0 eV was measured. Following the completion of measurement, a graph was created by plotting the energy of the irradiated light on the horizontal axis versus the square root of the measured photoelectron yield on the vertical axis, and the ionization potential was determined from the intersection of the straight-line extrapolation obtained by the method of least squares with the ground level. The result is shown in Table 2.

Working Example 3-2, Comparative Example 3

Aside from using the varnishes obtained in, respectively, Working Example 1-2 and Comparative Example 1 instead of the varnish obtained in Working Example 1-1, the ionization potentials were measured in the same way as in Working Example 3-1. These results are also shown in Table 2.

|  | Ionization potential (eV) |
| --- | --- |
| Comparative Example 3 | 5.2 |
| Working Example 3-1 | 5.3 |
| Working Example 3-2 | 5.4 |

It is apparent from Table 2 that the ionization potentials of thin-films obtained from the organosilane compound-containing charge-transporting varnishes of the invention were larger than that of a thin-film obtained from the charge-transporting varnish of the Comparative Example which does not contain an organosilane compound. Considered together with the results in Table 1, it is evident that the higher (deeper) ionization potential value provides improved brightness characteristics and current efficiency.

The invention claimed is:

1. A charge-transporting varnish comprising a charge-transporting substance, 1 to 20 wt %, based on the weight of the charge-transporting substance, of an organosiloxane compound, and an organic solvent, wherein the organosiloxane compound has a weight-average molecular weight of 500 to 10,000 and is prepared beforehand by hydrolytic condensation of at least one alkoxysilane compound selected from among alkoxysilane compounds of formulas (1-1) and (1-2)

$$SiR^1(OR^2)_3 \quad (1\text{-}1)$$

$$SiR^1{}_2(OR^2)_2 \quad (1\text{-}2)$$

wherein
each $R^1$ is independently an alkyl group of 1 to 20 carbon atoms that is substituted with $Z^1$ or an aryl group of 6 to 20 carbon atoms that is substituted with $Z^2$;
each $R^2$ is independently an alkyl group of 1 to 20 carbon atoms that may be substituted with $Z^3$;
$Z^1$ is a halogen atom, a cyano group, a nitro group, an alkoxy group of 1 to 20 carbon atoms that is substituted with $Z^3$, an aryl group of 6 to 20 carbon atoms that is substituted with $Z^3$, or a heteroaryl group of 2 to 20 carbon atoms that is substituted with $Z^3$;

$Z^2$ is a halogen atom, a cyano group, a nitro group, or an alkyl group of 1 to 20 carbon atoms that is substituted with $Z^3$; and $Z^3$ is a halogen atom, a cyano group or a nitro group.

2. The charge-transporting varnish of claim 1, wherein the alkoxysilane compound includes at least one compound selected from among alkoxysilane compounds of formulas (1-1) and (1-2) and at least one compound selected from among alkoxysilane compounds of formulas (2-1) to (2-3)

$$Si(OR^3)_4 \quad (2\text{-}1)$$

$$SiR^4{}_2(OR^3)_2 \quad (2\text{-}2)$$

$$SiR^4(OR^3)_3 \quad (2\text{-}3)$$

wherein
each $R^3$ is independently an alkyl group of 1 to 20 carbon atoms that may be substituted with $Z^3$;
each $R^4$ is independently an alkyl group of 1 to 20 carbon atoms, an alkenyl group of 2 to 20 carbon atoms that may be substituted with $Z^4$, an alkynyl group of 2 to 20 carbon atoms that may be substituted with $Z^4$, an aryl group of 6 to 20 carbon atoms, or a heteroaryl group of 2 to 20 carbon atoms that may be substituted with $Z^5$;
$Z^3$ is as defined above;
$Z^4$ is a halogen atom, a nitro group, a cyano group, a hydroxyl group, a thiol group, an aryl group of 6 to 20 carbon atoms that may be substituted with $Z^6$, or a heteroaryl group of 2 to 20 carbon atoms that may be substituted with $Z^6$;
$Z^5$ is a halogen atom, a nitro group, a cyano group, a hydroxyl group, a thiol group, an alkyl group of 1 to 20 carbon atoms that may be substituted with $Z^6$, an alkenyl group of 1 to 20 carbon atoms that may be substituted with $Z^6$, or an alkynyl group of 1 to 20 carbon atoms that may be substituted with $Z^6$; and
$Z^6$ is a halogen atom, a nitro group, a cyano group, a hydroxyl group or a thiol group.

3. The charge-transporting varnish of claim 1 or 2, wherein the alkoxysilane compound includes an alkoxysilane compound of formula (1-1) and an alkoxysilane compound of formula (2-1).

4. The charge-transporting varnish of claim 1, wherein the charge-transporting substance is an aniline derivative.

5. A charge-transporting thin-film produced using the charge-transporting varnish of claim 1.

6. An organic electroluminescent device comprising the charge-transporting thin-film of claim 5.

7. The organic electroluminescent device of claim 6, wherein the charge-transporting thin-film is a hole injection layer or a hole-transporting layer.

8. The organic electroluminescent device of claim 6, wherein the charge-transporting thin-film is a hole-transporting layer.

9. A method of fabricating an organic electroluminescent device, which method comprises the steps of
applying the charge-transporting varnish of claim 1 onto an anode substrate or a hole injection layer formed on the anode substrate, and
evaporating off the solvent to form a hole-transporting layer.

10. A method of producing a charge-transporting thin-film, which method is characterized by the steps of applying the charge-transporting varnish of claim 1 onto a substrate, and evaporating off the solvent.

11. A method of deepening the ionization potential of a charge-transporting thin-film obtained from a charge-transporting varnish containing a charge-transporting substance and an organic solvent, which method comprises the steps of, first,
preparing a polymer that has a weight-average molecular weight of 500 to 10,000 by hydrolytic condensation of at least one alkoxysilane compound selected from among alkoxysilane compounds of formulas (1-1) and (1-2)

$$SiR^1(OR^2)_3 \quad (1\text{-}1)$$

$$SiR^1{}_2(OR^2)_2 \quad (1\text{-}2)$$

wherein each $R^1$ is independently an alkyl group of 1 to 20 carbon atoms that is substituted with $Z^1$ or an aryl group of 6 to 20 carbon atoms that is substituted with $Z^2$; each $R^2$ is independently an alkyl group of 1 to 20 carbon atoms that may be substituted with $Z^3$; $Z^1$ is a halogen atom, a cyano group, a nitro group, an alkoxy group of 1 to 20 carbon atoms that is substituted with $Z^3$, an aryl group of 6 to 20 carbon atoms that is substituted with $Z^3$, or a heteroaryl group of 2 to 20 carbon atoms that is substituted with $Z^3$; $Z^2$ is a halogen atom, a cyano group, a nitro group, or an alkyl group of 1 to 20 carbon atoms that is substituted with $Z^3$; and $Z^3$ is a halogen atom, a cyano group or a nitro group and, subsequently,
adding said polymer to the charge-transporting varnish.

12. A method of deepening the ionization potential of a charge-transporting thin-film containing a charge-transporting substance, which method comprises the steps of, first,
preparing a polymer that has a weight-average molecular weight of 500 to 10,000 by hydrolytic condensation of at least one alkoxysilane compound selected from among alkoxysilane compounds of formulas (1-1) and (1-2) below into the charge-transporting thin-film together with the charge-transporting substance $$SiR^1(OR^2)_3 \quad (1\text{-}1)$$

$$SiR^1{}_2(OR^2)_2 \quad (1\text{-}2)$$

wherein each $R^1$ is independently an alkyl group of 1 to 20 carbon atoms that is substituted with $Z^1$ or an aryl group of 6 to 20 carbon atoms that is substituted with $Z^2$; each $R^2$ is independently an alkyl group of 1 to 20 carbon atoms that may be substituted with $Z^3$; $Z^1$ is a halogen atom, a cyano group, a nitro group, an alkoxy group of 1 to 20 carbon atoms that is substituted with $Z^3$, an aryl group of 6 to 20 carbon atoms that is substituted with $Z^3$, or a heteroaryl group of 2 to 20 carbon atoms that is substituted with $Z^3$; $Z^2$ is a halogen atom, a cyano group, a nitro group, or an alkyl group of 1 to 20 carbon atoms that is substituted with $Z^3$; and $Z^3$ is a halogen atom, a cyano group or a nitro group and, subsequently,
introducing said polymer into the charge-transporting thin-film, together with the charge-transporting substance, during formation of the charge-transporting thin-film.

* * * * *